United States Patent [19]

Daughton

[11] Patent Number: 5,595,830
[45] Date of Patent: *Jan. 21, 1997

[54] MAGNETORESISTIVE STRUCTURE WITH ALLOY LAYER HAVING TWO SUBSTANTIALLY IMMISCIBLE COMPONENTS

[75] Inventor: James M. Daughton, Edina, Minn.

[73] Assignee: Nonvolatile Electronics, Incorporated, Eden Prairie, Minn.

[ * ] Notice: The term of this patent shall not extend beyond the expiration date of Pat. No. 5,569,544.

[21] Appl. No.: 232,324

[22] Filed: Apr. 25, 1994

Related U.S. Application Data

[63] Continuation of Ser. No. 976,905, Nov. 6, 1992, abandoned.

[51] Int. Cl.$^6$ .................................................. G11B 5/66
[52] U.S. Cl. .................... 428/611; 428/635; 428/674; 428/675; 428/678; 428/692; 428/900; 428/928; 360/113; 360/126; 324/252
[58] Field of Search ................................ 428/611, 635, 428/674, 675, 678, 692, 900, 928; 360/113, 126; 324/252

[56] References Cited

U.S. PATENT DOCUMENTS

| | | | |
|---|---|---|---|
| 4,935,311 | 6/1990 | Nakatani et al. | 328/661 |
| 4,949,039 | 8/1990 | Grünberg | 324/252 |
| 5,134,533 | 6/1992 | Friedrich et al. | 360/113 |
| 5,157,570 | 10/1992 | Shukovsky et al. | 360/126 |
| 5,159,513 | 10/1992 | Dieny et al. | 360/113 |
| 5,206,590 | 4/1993 | Dieny et al. | 324/252 |
| 5,243,316 | 9/1993 | Sakakima et al. | 338/32 R |
| 5,287,238 | 2/1994 | Baumgart et al. | 360/113 |
| 5,315,282 | 5/1994 | Shinjo et al. | 338/32 R |
| 5,366,815 | 11/1994 | Akaki et al. | 428/611 |

FOREIGN PATENT DOCUMENTS

| | | |
|---|---|---|
| 0506433 | 9/1992 | European Pat. Off. . |
| WO92/15102 | 9/1992 | WIPO . |

OTHER PUBLICATIONS

Hansen, et al *Constitution of Binary Alloys* McGraw–Hill 1958 pp. 18, 19, 62, 63, 198, 199, 600, 601, 602, 603, 648, 649.

Elliot, Rodney *Constitution of Binary Alloys—First Supplement* McGraw–Hill 1965 pp. 6, 7, 14, 15, 86, 87, 88, 89, 200, 201, 378, 379.

"Magnetoresisitve Properties and Thermal Stability of Ni–Fe/Ag Multilayers," B. Rodmacq et al, *Journal of Magnetism and Magnetic Materials*, 118 (1993) pp. L11–L16.

"Oscillatory Magnetic Exchange Coupling through Thin Copper Layers," S. Parkin et al, *Physical Review Letters*, vol. 66, No. 16, 22 Apr. 1991, pp. 2152–2155.

"Giant Magnetoresistance in Narrow Stripes," J. Daughton et al, *IEEE Transactions on Magnetics*, vol. 2, No. 5, Sep. 1992.

Patent Abstracts of Japan vol. 016 No. 408 (E–1255), 28 Aug. 1992 & JP–A–04 1137572 (NEC Corp.) 12 May 1992 *Abstract*.

Primary Examiner—Stevan A. Resan
Attorney, Agent, or Firm—Kinney & Lange, P.A.

[57] ABSTRACT

A magnetoresistive layered structure having a pair of magnetoresistive, anisotropic ferromagnetic thin-films separated by an intermediate layer on a substrate of less than 50 Å thickness formed of a substantially nonmagnetic, conductive alloy having two immiscible components therein.

50 Claims, 1 Drawing Sheet

MAGNETORESISTIVE STRUCTURE WITH ALLOY LAYER HAVING TWO SUBSTANTIALLY IMMISCIBLE COMPONENTS

This invention was made with Government support under Contract DASG 60-C-0073 awarded by the U.S. Army. The Government has certain rights in the invention.

This is a Continuation of application Ser. No. 07/976,905, filed Nov. 6, 1992, now abandoned.

BACKGROUND OF THE INVENTION

The present invention relates to ferromagnetic thin-film structures and, more particularly, to ferromagnetic thin-film structures exhibiting relatively large magnetoresistive characteristics.

Many kinds of electronic systems make use of magnetic devices. Digital memories are used extensively in digital systems of many kinds including computers and computer systems components, and digital signal processing systems. Such memories can be advantageously based on the storage of digital bits as alternative states of magnetization in magnetic materials in each memory cell, particularly in cells using thin-film magnetic materials, resulting in memories which use less electrical power and do not lose information upon removals of such electrical power.

Magnetometers and other magnetic sensing devices are also used extensively in many kinds of systems including magnetic disk memories and magnetic tape storage systems of various kinds. Such devices provide output signals representing the magnetic fields sensed thereby in a variety of situations.

Such memory cells and sensors can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This is considerably enhanced by choosing the separating material in the ferromagnetic thin-film memory cells to each be sufficiently thin. Similar "sandwich" structures are also used in magnetic sensing structures.

In the recent past, reducing the thicknesses of the ferromagnetic thin-films and the intermediate layers in extended "sandwich" structures having additional alternating ones of such films and layers, i.e. superlattices, have been shown to lead to a "giant magnetoresistive effect" being present. This effect yields a magnetoresistive response which can be in the range of up to an order of magnitude greater than that due to the well-known anisotropic magnetoresistive response.

In the ordinary anisotropic magnetoresistive response, varying differences between the direction of the magnetization vector in the ferromagnetic film and the direction of the sensing current passed through the film lead to varying differences in the effective electrical resistance in the direction of the current. The maximum electrical resistance occurs when the magnetization vector in the film and the current direction are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance follows a square of the cosine of that angle.

As a result, operating external magnetic fields can be used to vary the angle of the magnetization vector in such a film portion with respect to the easy axis of that film portion which comes about because of an anisotropy therein typically resulting from depositing the film in the presence of a fabrication external magnetic field oriented in the plane of the film along the direction desired for the easy axis in the resulting film. During subsequent operation of the device with the resulting film, such operating external magnetic fields can vary the angle to such an extent as to cause switching of the film magnetization vector between two stable states which occur as magnetizations oriented in opposite directions along that easy axis. The state of the magnetization vector in such a film portion can be measured, or sensed, by the change in resistance encountered by current directed through this film portion. This arrangement has provided the basis for a ferromagnetic, magnetoresistive anisotropic thin-film to serve as part of a memory cell.

In contrast to this arrangement, the resistance in the plane of a ferromagnetic thin-film is isotropic with respect to the giant magnetoresistive effect rather than depending on the direction of a sensing current therethrough as for the anisotropic magnetoresistive effect. The giant magnetoresistive effect has a magnetization dependent component of resistance that varies as the cosine of the angle between magnetizations in the two ferromagnetic thin-films on either side of an intermediate layer. In the giant magnetoresistive effect, the electrical resistance through the "sandwich" or superlattice is lower if the magnetizations in the two separated ferromagnetic thin-films are parallel than it is if these magnetizations are antiparallel, i.e. directed in opposing directions. Further, the anisotropic magnetoresistive effect in very thin-films is considerably reduced from the bulk values therefor in thicker films due to surface scattering, whereas very thin-films are a fundamental requirement to obtain a significant giant magnetoresistive effect.

In addition, the giant magnetoresistive effect can be increased by adding further alternate intermediate and ferromagnetic thin-film layers to extend a "sandwich" or superlattice structure. The giant magnetoresistive effect is sometimes called the "spin valve effect" in view of the explanation that a larger fraction of conduction electrons are allowed to move more freely from one ferromagnetic thin-film layer to another if the magnetizations in these layers are parallel than if they are antiparallel with the result that the magnetization states of the layers act as sort of a valve.

These results come about because of magnetic exchange coupling between the ferromagnetic thin-films separated by the intermediate layers, these intermediate layers typically formed from a nonferromagnetic transition metal. The effect of the exchange coupling between the ferromagnetic thin-film layers is determined to a substantial degree by the thickness of such an intermediate layer therebetween. The effect of the coupling between the separated ferromagnetic thin-film layers has been found to oscillate as a function of this separation thickness between these layers in being ferromagnetic coupling (such that the magnetizations of the separated layers are parallel to one anther) and antiferromagnetic coupling (such that the magnetizations of the separated layers are opposed to one another, or antiparallel to one another). Thus, for some separation thicknesses, the layer coupling will be of zero value between extremes of such oscillations.

Exhibiting the giant magnetoresistive effect in a superlattice structure, or in an abbreviated superlattice structure formed by a three layer "sandwich" structure, requires that there be arrangements in connection therewith that permit the establishment alternatively of both parallel and antiparallel orientations of the magnetizations in the alternate ferromagnetic thin-film layers therein. One such arrangement is to have the separated ferromagnetic thin-films in the multilayer structure be antiferromagnetically coupled but to a sufficiently small degree so that the coupling field can be overcome by an external magnetic field.

Another arrangement is to form the ferromagnetic thin-film layers with alternating high and low coercivity materials so that the magnetization of the low coercivity material layers can be reversed without reversing the magnetizations of the others. A further alternative arrangement is to provide "soft" ferromagnetic thin-films and exchange couple every other one of them with an adjacent magnetically hard layer (forming a ferromagnetic thin-film double layer) so that the ferromagnetic double layer will be relatively unaffected by externally applied magnetic fields even though the magnetizations of the other ferromagnetic thin-film layers will be subject to being controlled by such an external field.

One further alternative arrangement, related to the first, is to provide such a multilayer structure that is, however, etched into strips such that demagnetizing effects and currents in such a strip can be used to orient the magnetizations antiparallel, and so that externally applied magnetic fields can orient the magnetizations parallel. Thus, parallel and antiparallel magnetizations can be established in the ferromagnetic thin-films of the structure as desired in a particular use. Such a structure must be fabricated so that any ferromagnetic or antiferromagnetic coupling between separated ferromagnetic films is not too strong so as to prevent such establishments of film magnetizations using practical interconnection arrangements.

A broader understanding of the giant magnetoresistance effect, i.e. the spin valve effect, can be obtained by considering a generalized multilayer structure shown in FIG. 1 and ignoring, for simplicity though this is not necessary, the ordinary anisotropic magnetoresistive effect. The structure is typically provided on a semiconductor chip, 10, having suitable operating circuitry therein. An electrical insulating layer, 11, supports N identical ferromagnetic thin-film conductive layers, each separated from an adjacent one by one of N-1 identical nonmagnetic, conductive intermediate layers to form a superlattice structure. A highly resistive outer passivation layer, 13, covers this structure, and suitable electrical interconnections are made to the conductive layers but not shown. The conductance of this superlattice structure will be the sum of the conductances of the individual layers which are effectively electrically in parallel with one another, but the giant magnetoresistive effect introduces magnetization dependence in the ferromagnetic thin-films. In the following, a possible model is developed to an extent as a basis for gaining a better understanding of the electrical and magnetic behavior of this structure, but this model is simplified by approximations and not all would agree with every aspect of the approach chosen.

The conductance of very thin-films is highly dependent on surface scattering if the mean-free path of conduction electrons in the bulk material of the films is equal to or longer than the thickness of the films. The ratio of the film conductivity to the conductivity of the film material in bulk can be expressed as a function of the ratio of the film thickness to the mean-free path of electrons in bulk material identical to the film material by the well known Fuchs-Sondheim conduction model assuming inelastic scattering at the film surfaces, or by other associated models taking further conditions into account such as grain boundary scattering and other surface scatterings.

The magnetization dependence in the ferromagnetic thin-films leading to the giant magnetoresistive effect appears dependent on the ratio of spin up to spin down electrons in the 3D shell of the transition elements used in the ferromagnetic thin-films, i.e. the spin polarization P of the conduction electrons. The fraction f of 3D electrons which are spin up have typical values of 0.75 for iron, 0.64 for cobalt and 0.56 for nickel. Conduction electrons in metals are normally S shell electrons which theoretically would be equally divided between spin up and spin down electrons. However, because of band splitting, the conduction electrons in the magnetic layers are assumed to have a fraction of spin up electrons like that of the electrons in the 3D shell. The spin polarization is then determined from P=2f−1. Such electrons are assumed in encounters with atomically perfect boundaries between the magnetic layers, including in this boundary the thin nonmagnetic, conductive intermediate layer therebetween, to be either scattered inelastically or pass freely into the next magnetic layer.

In view of the observed spin polarization, the simplifying assumption is made that the probability of a spin up electron not being scattered in entering a material having a majority of spin up electrons is approximately equal to the fraction of the electrons in the conduction band which are spin up, and that the probability of a spin down electron going into the same material not being scattered is equal to the fraction of the electrons in the conduction band which are spin down. Changing the magnetization directions between parallel and antiparallel in adjacent ferromagnetic thin-films changes the conduction band electrons in the films from having matching spin up and spin down fractions in each to having opposite spin up and spin down fractions in each. Thus, a larger fraction of the electrons in the superlattice structure will be scattered when the magnetizations in the ferromagnetic thin-films are antiparallel as compared to when they are parallel, since more than half of the electrons in the conduction band are spin up in view of the spin up fraction values given above. If the ferromagnetic thin-films are separated by a conductor layer which preserves the spin of the conduction electrons in passing therethrough, some conduction electrons can pass from one layer to the other without collisions and so can travel through effectively a thicker layer than those which are scattered to thereby be confined within a single layer. As a result, the scattered electrons can follow paths having a significantly lower conductivity and so, if the ferromagnetic films are oppositely magnetized, there will be a greater effective resistance in the structure. This view of the conduction electron transport between ferromagnetic thin-film layers can be adjusted for imperfections at the boundaries between adjacent ferromagnetic thin-films for conduction band electrons, which would not be scattered because of the spin thereof, may instead be scattered by physical imperfections at the boundary.

Based on the foregoing, the effective conductivities for parallel and antiparallel magnetization states in the superlattice structure can be determined, and subtracted from one another to provide the ratio of change in effective conductivities of the ferromagnetic thin-films, due to a corresponding change between parallel and antiparallel magnetizations in those films, to the average conductivity in those films. The result of this determination must have added to it the conductivities of the nonmagnetic, conductive intermediate layers on the basis of those layers having equal populations of spin up and spin down conduction band electrons, and a conductivity which does not change with magnetization directions. In such a setting, the ratio of the difference in sheet conductances of the superlattice structure when the ferromagnetic thin-films change magnetization from parallel to antiparallel, $\Delta\gamma_{\perp\to\blacksquare}$, to the average of these sheet conductances, $\gamma_{\perp\to\blacksquare}$, can be obtained as $$\frac{\Delta\gamma_{\perp\to\blacksquare}}{\gamma_{\perp\to\blacksquare}} = \frac{Nqp^2(\gamma_{mN}-\gamma_{m1})}{\frac{N}{2}[q\gamma_{mN}+(2-q)\gamma_{m1}]+(N-1)q\gamma_{c1}},$$

ignoring the ordinary anisotropic magnetoresistance in obtaining this giant magnetoresistive response as indicated above. Here q represents physical boundary imperfections, and is the probability that a conduction electron which would not be scattered because of its spin is also not scattered by physical imperfections or collisions in the nonmagnetic, conductive intermediate layers.

The symbol $\gamma_{m1}$ is the sheet conductance in a single ferromagnetic thin-film, the sheet conductance per unit square of a thin-film being the conductivity thereof multiplied by the thickness thereof. Thus, $N\gamma_{m1}$ is the sheet conductance of N parallel ferromagnetic thin-films. The symbol $\gamma_{mN}$ is the sheet conductance of a layer of ferromagnetic thin-film N times the thickness of a single ferromagnetic thin-film, and $\gamma_{c1}$ is the sheet conductance of a nonmagnetic, conductive intermediate layer.

The number N of ferromagnetic thin-films affects the differences in sheet conductances because of the difference in conductivity between a ferromagnetic thin-film which is N layers thick compared to N ferromagnetic thin-films electrically connected in parallel. The polarization factor P is, as indicated above, expected to be important in the giant magnetoresistive response in representing the fraction of spin up conduction band electrons, and this expectation is borne out by the square of that factor appearing in the numerator of the equation above.

The quality of the interface between the ferromagnetic thin-films and the nonmagnetic, conductive intermediate layers is important as represented in the last equation by the symbol q. The largest giant magnetoresistive effect values have been obtained in material systems where both the lattice constant of the crystal and the form in the crystal class of each interface material have been well matched. For example, chromium matches the body-centered cubic structure of iron better than all other natural body-centered cubic nonmagnetic metals. Copper is similarly the best match for face-centered cubic cobalt and for face-centered permalloy mixtures which are quite similar to nickel. Significant mismatches will likely give a very low value for q.

Also, scattering in the nonmagnetic, conductive intermediate layers is likely if the thickness of those layers is smaller than the mean-free path of conduction electrons in the bulk film material. 10 Hence, the symbol q will be reduced in value for thicker intermediate films.

The film thickness also has a significant effect on the ratio of $\gamma_{mN}/\gamma_{m1}$ with this ratio increasing as the films get thinner, as shown by the Fuchs-Sondheim conduction model. The greatest conductivity difference between parallel and antiparallel magnetizations in the ferromagnetic thin-films can be seen, from the last expression above, to occur in the very thinnest of magnetic layers were it not for the scattering and shunting effects of the nonmagnetic, conductive intermediate layers. However, once the conductance of the magnetic layers, decreasing in being made thinner, gets to be on the order of the conductance of the nonmagnetic, conductive layers, the expression above shows that further decreases in thickness will reduce the giant magnetoresistive effect. Thus, for a fixed set of parameters for the nonmagnetic, conductive intermediate layer, the giant magnetoresistive effect will have a peak in value at some ferromagnetic thin-film thickness.

This assumes that the coupling between the structure ferromagnetic thin-films is also arranged to result in an operable device since it determines the range of magnetization angles which can be achieved in a device for given values of applied magnetic fields, so sets limits on the magnetoresistive response. If positive, or ferromagnetic, coupling is present and too great, the film magnetizations will not be sufficiently close to being antiparallel, and perhaps cannot be made so by passing a sensing current through the structure, so that the maximum resistance expected for the configuration cannot be obtained. On the other hand, if negative, or antiferromagnetic, coupling is present and too great, the film magnetizations will not be sufficiently close to being parallel, and perhaps cannot be made so by applying an external magnetic field to the structure, so that the minimum resistance expected for the configuration cannot be obtained.

Further, there is a limit on the thinness of the nonmagnetic, conductive intermediate layer because of "pin holes" occurring therethrough which result in that layer covering less than 100% of the surfaces of the ferromagnetic thin-films on either side thereof. These "pin holes" in the nonmagnetic, conductive intermediate layers are thought to lead to a current density dependence in the giant magnetoresistive effect which is not reflected in the last expression above. Such pin holes in this intermediate layer appear to result in ferromagnetic coupling between the ferromagnetic thin-films on either side of that layer in the vicinity of such holes thereby creating ferromagnetically coupled magnetic domains in these ferromagnetic thin-films which are otherwise antiferromagnetically coupled (assuming no external magnetic fields being applied).

As a result, there appears to be an incomplete saturation of magnetizations across the superlattice along the easy axes so that higher currents through the superlattice structure generate a "scissoring" magnetic field (a field forcing magnetizations in films adjacent an intermediate layer in opposite directions) which counteracts the effects of the pin holes by forcing the magnetizations in the pin hole domains to more closely align with the magnetizations in the rest of the ferromagnetic thin-film in which they occur. Sufficiently high currents can leave a single domain in each such ferromagnetic thin-film.

Although the effect of a very low pin hole density can be perhaps corrected by providing a sensing current of a sufficient current density through the superlattice structure, a relatively small increase in pin hole density will quickly lead to all of the ferromagnetic thin-films being ferromagnetically coupled so that the magnetizations therein are in, or near to being in, a common direction. Such a result will make the superlattice structure inoperable as a device, and so there is a desire to provide thin nonmagnetic, conductive intermediate layers with reduced pin hole densities.

SUMMARY OF THE INVENTION

The present invention provides a magnetoresistive layered structure having a pair of magnetoresistive, anisotropic ferromagnetic thin-films separated by an intermediate layer on a substrate, the intermediate layer of less than 50 Å thickness formed of a substantially nonmagnetic, conductive alloy material. This alloy is formed by having two immiscible components therein. One alloy component can be present in greater proportion than others and can be of a kind that permits antiferromagnetic coupling between the ferromagnetic thin-films. Another alloy component can be present in an amount sufficient for the alloy to permit antiferromagnetic coupling between these ferromagnetic thin-films. The thin-films may be two-strata films each having a greater magnetic moment statum against the intermediate layer. Further, each strata may be non-magnetostrictive so as to result in the thin-film being non-magnetostrictive.

DETAILED DESCRIPTION OF THE PREFERRED EMBODIMENTS

Figure 1:
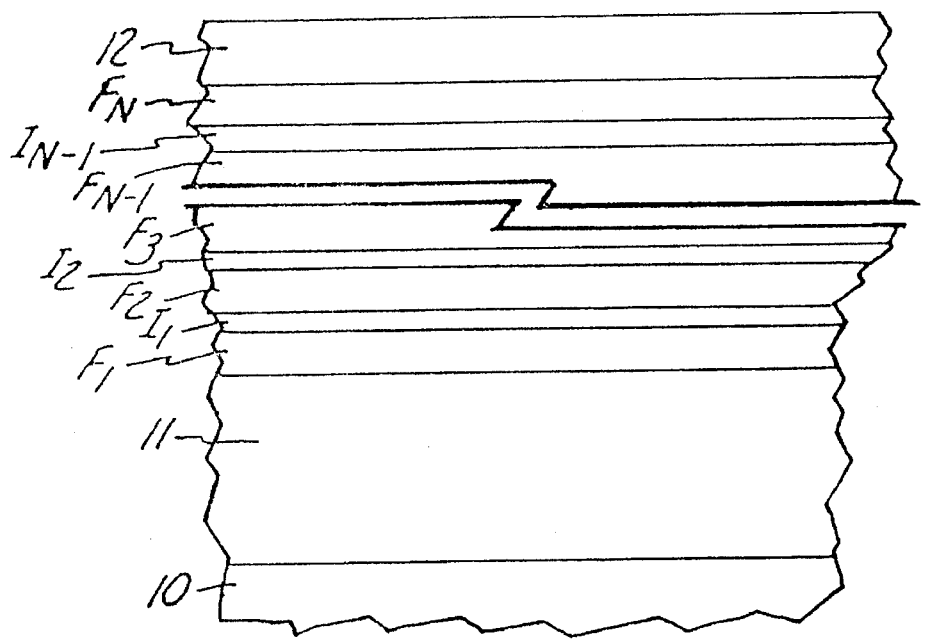
FIG. 1 is a diagrammatic representation of a portion of a device known in the prior art.
Figure 2:
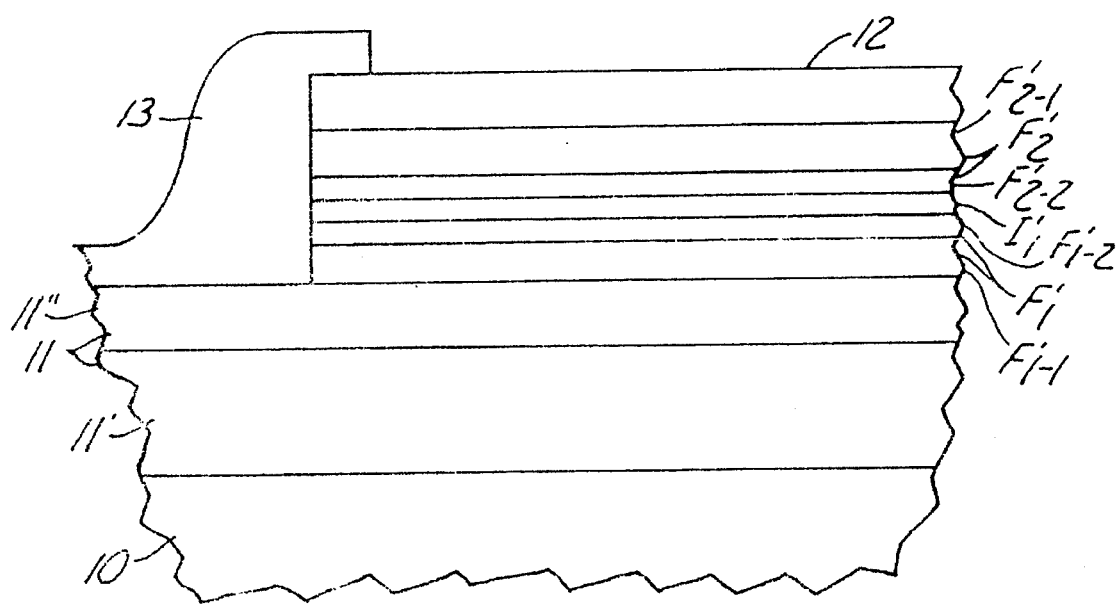
FIG. 2 is a diagrammatic representation of a portion of a device embodying the present invention.

FIG. 2 shows in diagrammatic form a cross sectional view of a portion of a superlattice device formed in a monolithic integrated circuit chip, or on a ceramic substrate, or on other suitable material. Here, a "sandwich" structure with just two ferromagnetic thinfilms with general designations $F'_1$ and $F'_2$ is shown separated by an intermediate layer $I'_1$ as an abbreviated superlattice, but additional alternating layer pairs of intermediate layers and ferromagnetic thin-films could be provided in a larger superlattice structure to increase the giant magnetoresistive effect in the same manner as is shown in FIG. 1. FIG. 2 is not to scale, and is not in proportion, for purposes of clarity, which is also true of FIG. 1.

The integrated circuit chip, or other substrate, has again semiconductor material or other suitable material for substrate 10 which, in the situation of semiconductor material in an integrated circuit chip, has therein electronic integrated circuits provided for operating the abbreviated superlattice structure device thereon. Such a device could be intended for use as a memory cell in a digital memory or as a magnetic sensor, for instance. An electrically insulating layer again designated 11 is once more provide on substrate 10, the upper surface of layer 11 in the device portion shown supporting the abbreviated superlattice structure indicated above. Insulating layer 11 is shown here as two separate layers, a lower layer, 11' formed of silicon dioxide perhaps 2,000 to 6,000 Å thick, and an upper layer, 11" formed of silicon nitride having a typical thickness of 100 to 1,000 Å. Layers 11' and 11" are typically provided in a well-known sputter deposition step. Use of nitride layer 11" prevents oxygen atoms from diffusing into the layer to be provided thereon which could chemically attack that layer.

The silicon nitride in layer 11" provides an amorphous insulator, that is, an insulator without any periodic structure typical of crystallinity, or, in other words, no long range atomic or molecular order. Alternatively, layer 11" can be formed of a material which has the same form in the same crystallinity class that the next succeeding layer has to provide a possibly better match between these two materials. Since a permalloy material will be used in the succeeding layer in a face-centered cubic structure, an alternative material would be magnesium oxide which also has a cubic structure and a compatible lattice constant.

The next process step in forming the structure of FIG. 2 is the sputter deposition of 40 to 50 Å of a permalloy material comprising 20% cobalt, 15% iron and 65% nickel in the presence of an external magnetic field in the plane of the film oriented along a perpendicular to the view shown in that figure which, as just indicated, results in a film having a face-centered cubic structure. Also, the composition of this mixture in forming a permalloy material leaves the layer with approximately zero magnetorestriction, and the fabrication magnetic field leaves the film easy axis along the perpendicular followed by the fabrication field. The magnetic moment of this material is typically about 12,000 gauss. This is designated in FIG. 2 as component $F'_{1-1}$ of film $F'_1$, and is the first stratum in two strata first ferromagnetic thin-film $F'_1$.

A second stratum, $F'_{1-2}$, is provided in a sputter deposition step, performed in the presence of a similar fabrication magnetic field, as a material formed from 95% cobalt and 5% iron to a thickness of at least 10 Å to get the full giant magnetoresistive effect, and typically of 15 Å thickness. The magnetic moment of this material is 16,000 gauss, a value higher than that of the magnetic moment of first stratum $F'_{1-1}$ in first ferromagnetic thin-film $F'_1$. Since, as a general matter, the polarization of a material and the magnetic moment thereof each tend to increase when the other does, a higher magnetization moment material in the structure ferromagnetic films gives a larger giant magnetoresistive response, as can be seen from the expression above where the square of the polarization appears in the numerator. Thus, having a ferromagnetic stratum with the greater magnetic moment nearest the intermediate layer will typically result in a larger giant magnetoresistive response.

On the other hand, rotating the film magnetization to change its direction in second stratum $F'_{1-2}$ by an external magnetic field during operation is more difficult in this harder magnetic material. As a result, providing first stratum $F'_{1-1}$ as a permalloy material which is a softer magnetic material than that of the second stratum, the magnitudes required of external magnetic fields in operating the device will be kept at values which do not require too large a current to flow in the interconnections of the device. Hence, a two strata ferromagnetic thin-film provides a more optimal ferromagnetic thin-film for a superlattice structure intended to provide a giant magnetoresistive effect response in a monolithic integrated circuit chip. Also, the magnetorestriction for second stratum $F'_{1-2}$ remains near zero so that first ferromagnetic thin-film $F'_1$ will not have undue forces arising between that film and the substrate below, or the film on the other side thereof, in the presence of magnetic fields which could lead at some point to a mechanical failure of the device.

As indicated above, the provision of an intermediate layer, typically copper, in thicknesses below 30 Å leads to increasing pin hole density as the thickness of such a layer diminishes. The magnetic coupling field begins to rise into the tens of oersteds as this copper thickness goes below this 25 to 30 Å value (there is significant variation with different deposition parameter values in the sputter deposition of that layer). Yet, as indicated above, the thickness of the intermediate layer must be reduced as the thickness of the ferromagnetic thin-films is reduced to increase the potential for a larger giant magnetoresistive effect. The thickness of the nonmagnetic, conductive intermediate layer is reduced so that its shunting effect does not become too great with respect to the decrease in conductance of the ferromagnetic thin-films as they are reduced in thickness. Hence, a measure to avoid an increasing pin hole density as the intermediate layer is reduced will provide a basis for achieving a higher giant magnetoresistive effect.

Thus, an intermediate layer, $I'_1$, is provided in the form of an eutectic alloy through including therein two metals as components of the eutectic alloy which are substantially immiscible with one another so that pin holes forming in the larger fraction component are "filled in" to a substantial degree by the smaller fraction component. Since the face-centered cubic center of copper, and its lattice constant, are well matched with that of second stratum $F'_{1-2}$, as described above, the basic component choice of copper is made for the eutectic alloy to form the intermediate layer. A second component is chosen to be silver which has a face-centered cubic structure like copper although it has a slightly larger lattice constant. Silver and copper are only slightly soluble in one another in forming solid solutions, a few tenths of a percent, and form a eutectic alloy having a conductivity which is about 2 to 3 $\mu\Omega$-cm which value is substantially maintained over a wide range of relative composition of these two metals in the resulting eutectic alloy.

Though copper is quite able to enter into solid solution with iron, nickel and cobalt, silver is substantially immiscible with these materials also. Hence, a very thin film of a copper and silver eutectic alloy can be formed as a very thin intermediate layer in which a silver-rich phase material "fills in" the pin holes which occur in the copper-rich phase material constituting the bulk of thin intermediate layer $I'_1$. The typical thickness used for such an eutectic alloy film as intermediate layer $I'_1$ is on the order of 14 to 17 Å, with typically 15 Å being chosen.

In an intermediate layer of copper alone provided by sputter deposition, there will be strong ferromagnetic coupling between the ferromagnetic thinfilms it separates, whereas the addition to a film of the same thickness of silver from approximately 15% to 28% by weight in the sputter deposition process will result in antiferromagnetic coupling of a relatively low value. Such a result can be extended to a superlattice structure of a larger number of alternating intermediate and ferromagnetic thin-film layers than shown in FIG. 2 with a similar result.

The relative amount of silver in the film has been kept as small as possible in achieving such antiferromagnetic coupling both because silver by itself is known to lead to strong ferromagnetic coupling, and because the lattice mismatch of silver with first ferromagnetic thin-film second stratum $F'_{1-2}$ on each side thereof is significantly larger than is that of copper. Nevertheless, keeping the relative fraction of silver to less than 30% results in the reduction of the giant magnetoresistive response due thereto, because of lattice mismatch, being substantially less than the gains in the giant magnetoresistive effect due to lowered or eliminated ferromagnetic coupling. In some situations, even greater fractions of silver are expected to be suitable.

Thus, intermediate layer $I'_1$ is formed by sputter deposition using a copper sputtering target. That copper target is supplemented by the addition of silver tabs thereto to the extent needed to result in the desired silver relative fraction of the resulting eutectic alloy, a fraction typically chosen to be 23% to give the desired result. A separate silver sputtering deposition target could be used with a copper target or, alternatively, a copper-silver eutectic alloy target could be used having the same composition as is desired for films deposited therefrom. The intermediate layer from such a deposition step is a metastable face-centered cubic structure which typically remains stable for a long duration within expected temperature ranges which the device will experience thereafter. As an alternative, gold may be used in place of silver in the eutectic alloy as it is also relatively immiscible in copper.

The provision of intermediate layer $I'_1$ is followed by providing a second two-strata ferromagnetic thin-film, $F'_2$. A lower stratum for this film, $F'_{2-2}$, is deposited in the same manner as, with the result thereof being substantially the same as, upper stratum $F'_{1-2}$ of first ferromagnetic film $F'_1$. Similarly, an upper stratum, $F'_{2-1}$, of second ferromagnetic film $F'_2$ is deposited in the same manner as, with the result thereof being substantially the same as, lower stratum $F'_{1-1}$ of first ferromagnetic film $F'_1$. Finally, a tantalum nitride layer, 12, is provided on second ferromagnetic film $F'_2$ as a passivation and protection layer. After a completion of passivation layer 12, ion milling is used to form the abbreviated superlattice structure in the form of a strip supported on layer 11". A tantalum interconnection, 13, is shown formed across the end of the abbreviated superlattice structure and onto the upper surface of layer 12.

Thus, the abbreviated superlattice of FIG. 2 provides antiferromagnetically coupled ferromagnetic thin-film layers separated by a nonmagnetic, conductive intermediate layer. This structure has provided coupling fields of 10 to 15 oersteds, well within the desired range of zero to 50 oersteds to permit relatively easy manipulations of the magnetizations in the ferromagnetic thin-films of the structure by external magnetic fields. Thus, the magnetizations in each of ferromagnetic thin-films $F'_1$ and $F'_2$ are stable when directed antiparallel to one another in and out of the plane of the paper on which is shown FIG. 2, i.e. along the easy axis of the structure in that figure.

In this last magnetization condition, there is no anisotropic magnetoresistive effect contribution to the resistance of the device since any sensing current passing therethrough from interconnection 13 on the end shown in FIG. 2 to a similar interconnection on the opposite end of the structure, not shown in that figure, is perpendicular to the magnetizations in both ferromagnetic thin-films. The giant magnetoresistive effect gives a maximum resistance in this condition since the magnetizations of the two ferromagnetic thin-films $F'_1$ and $F'_2$, as stated above, have antiparallel magnetizations.

If an external magnetic field is applied directed into the plane of the paper on which FIG. 2 is presented, the anisotropic magnetoresistive effect contribution to the resistance of the device is unchanged since a sufficiently strong external field leaves the film magnetizations parallel to one another. However, assuming the external field is sufficient to rotate the magnetization in the opposite direction in which it was oriented prior to the application of the field, as occurs for the magnetization of one of the ferromagnetic thin-films, the giant magnetoresistive effect contribution to the resistance will be minimized since the magnetizations are then parallel to one another each oriented in the same direction.

If, in the alternative, the external magnetic field is applied parallel to the strip, and so along the plane of the paper in which FIG. 2 is provided, the giant magnetoresistive effect contribution to the resistance will remain a minimum since the magnetization in each of ferromagnetic thin-films $F'_1$ and $F'_2$ will be rotated to point in the long direction of the strip and so be parallel to one another. On the other hand, anisotropic magnetoresistance effect will make its maximum contribution to the resistance since the magnetizations in each ferromagnetic thin-film, in being parallel to the long direction of the strip, are also parallel to any sensing current being conducted between interconnection 13 and its counterpart at the opposite end of the strip.

Such external magnetic fields have been assumed sufficiently large in the foregoing to force the magnetizations in ferromagnetic thin-films $F'_1$ and $F'_2$ to become aligned with the direction of that field. This may be appropriate for use in a magnetoresistive state sensing memory. Alternatively, the external fields may be such that they cause only partial rotations in the magnetizations allowing the abbreviated superlattice to serve as a magnetic field sensor.

Although the present invention has been described with reference to preferred embodiments, workers skilled in the art will recognize that changes may be made in form and detail without departing from the spirit and scope of the invention.

What is claimed is:

1. A magnetoresistive thin-film layer structure, said structure comprising:

a substrate having a major surface portion;

a magnetoresistive, anisotropic first ferromagnetic thin-film provided on said substrate major surface portion;

an intermediate layer provided on said first ferromagnetic thin-film with a thickness of less than 30 Å, said intermediate layer being formed of a substantially nonmagnetic, conductive alloy having two substantially immiscible components therein; and a magnetoresistive, anisotropic second ferromagnetic thin-film provided on said intermediate layer.

2. The structure of claim 1 wherein said substrate major surface portion is electrically insulative.

3. The structure of claim 1 wherein said first ferromagnetic thin-film has a thickness of less than 100 Å.

4. The structure of claim 1 wherein said first ferromagnetic thin-film is a two strata film with that strata thereof at said intermediate layer having a greater magnetic moment than that strata remaining.

5. The structure of claim 1 wherein said intermediate layer has substantially that same form in that same crystal lattice class as does said first ferromagnetic thin-film.

6. The structure of claim 1 wherein said alloy is an eutectic alloy.

7. The structure of claim 1 wherein said substantially immiscible components are copper and silver.

8. The structure of claim 1 wherein said substantially immiscible components are copper and gold.

9. The structure of claim 1 wherein said second ferromagnetic thin-film has a thickness of less than 100 Å.

10. The structure of claim 1 wherein said second ferromagnetic thin-film is a two strata film with that strata thereof at said intermediate layer having a greater magnetic moment than that strata remaining.

11. The structure of claim 1 wherein said first ferromagnetic thin-film has that same form in that same crystal lattice class as does said intermediate layer.

12. The structure of claim 2 wherein said substrate is an amorphous material at said major surface portion thereof.

13. The structure of claim 2 wherein said substrate is a crystalline material at said major surface portion thereof.

14. The structure of claim 4 wherein said first strata of said first ferromagnetic thin-film is on said substrate major surface and comprises a mixture of cobalt, iron and nickel, and wherein said second strata thereof supports said intermediate layer and comprises a mixture of cobalt and iron.

15. The structure of claim 4 wherein said first strata of said first ferromagnetic thin-film is on said substrate major surface and has a particular form in a crystal lattice class, and wherein said second strata thereof supports said intermediate layer and has that same form in that same crystal lattice class as does said first strata.

16. The structure of claim 5 wherein said intermediate layer and said first ferromagnetic thin-film each have approximately equal lattice constants.

17. The structure of claim 6 wherein said eutectic alloy has one said component therein in greater proportion than that one remaining, and with that one component remaining being present in said eutectic alloy in an amount sufficient to permit antiferromagnetic coupling between said first and second ferromagnetic thin-films.

18. The structure of claim 7 wherein said silver is present in said copper in said alloy in an amount sufficient to permit antiferromagnetic coupling between said first and second ferromagnetic thin-films.

19. The structure of claim 8 wherein said gold is present in said copper in said alloy in an amount sufficient to permit antiferromagnetic coupling between said first and second ferromagnetic thin-films.

20. The structure of claim 10 wherein said first strata of said second ferromagnetic thin-film is on said intermediate layer and comprises a mixture of cobalt and iron, and wherein said second strata thereof is on said first strata thereof and comprises a mixture of cobalt, iron and nickel.

21. The structure of claim 10 wherein said first strata of said second ferromagnetic thin-film is on said intermediate layer and has that same form in that same crystal class as does said intermediate layer, and wherein said second strata thereof is on said first strata thereof and has that same form in that same crystal lattice class as does said first strata.

22. The structure of claim 11 wherein said intermediate layer and said first ferromagnetic thin-film each have approximately equal lattice constants.

23. A magnetoresistive thin-film layered structure, said structure comprising:

a substrate having a major surface portion;

a magnetoresistive, anisotropic first ferromagnetic thin-film provided on said substrate major surface portion;

an intermediate layer provided on said first ferromagnetic thin-film with a thickness of less than 30 Å, said intermediate layer being formed of a substantially non-magnetic, conductive alloy having two substantially immiscible components therein; and a magnetoresistive, anisotropic second ferromagnetic thin-film provided on said intermediate layer, said alloy in said intermediate layer having one said component therein in greater proportion than that one remaining and of a kind that permits antiferromagnetic coupling between said first and second ferromagnetic thin-films, and with that one component remaining being present in said alloy in an amount sufficient to permit antiferromagnetic coupling between said first and second ferromagnetic thin-films.

24. The structure of claim 23 wherein said first ferromagnetic thin-film is a two strata film with that strata thereof at said intermediate layer having a greater magnetic moment than that strata remaining.

25. The structure of claim 23 wherein said alloy is an eutectic alloy.

26. The structure of claim 23 wherein said substantially immiscible components are copper and silver.

27. The structure of claim 23 wherein said substantially immiscible components are copper and gold.

28. The structure of claim 23 wherein said first and second ferromagnetic thin-films have a thickness of less than 100 Å.

29. The structure of claim 23 wherein said second ferromagnetic thin-film is a two strata film with that strata thereof at said intermediate layer having a greater magnetic moment than that strata remaining.

30. A magnetoresistive thin-film layered structure, said structure comprising:

a substrate having a major surface portion;

a non-magnetostrictive, magnetoresistive, anisotropic first ferromagnetic thin-film provided on said substrate major surface; and a non-magnetostrictive, magnetoresistive, anisotropic second ferromagnetic thin-film provided on said first ferromagnetic thin-film with a magnetic moment differing therefrom to form a first composite thin-film therewith, said first composite thin-film being substantially free of magnetostriction.

31. The structure of claim 30 wherein said substrate major surface portion is electrically insulative.

32. The structure of claim 30 wherein said first composite thin-film has a thickness of less than 100 Å.

33. The structure of claim 1 wherein said second ferromagnetic thin-film has a composition differing from that of said first ferromagnetic thin-film.

34. The structure of claim 30 further comprising:

an intermediate layer provided on said second ferromagnetic thin-film with a thickness of less than 50 Å;

a non-magnetostrictive, magnetoresistive, anisotropic third ferromagnetic thin-film provided on said intermediate layer; and a non-magnetostrictive, magnetoresistive, anisotropic fourth ferromagnetic thin-film provided on said third ferromagnetic thin-film to form a second composite thin-film therewith, said second composite thin-film being substantially free of magnetostriction.

35. The structure of claim 31 wherein said substrate is an amorphous material at said major surface portion thereof.

36. The structure of claim 32 wherein said substrate is a crystalline material at said major surface portion thereof.

37. The structure of claim 32 wherein said second ferromagnetic thin-film has a thickness of less than 25 Å.

38. The structure of claim 33 wherein said first ferromagnetic thin-film has a particular form in a crystal lattice class, and wherein said second ferromagnetic thin-film has that same form in that same crystal lattice class as does said first ferromagnetic thin-film.

39. The structure of claim 33 wherein said first ferromagnetic thin-film has a thickness differing from that of said second ferromagnetic thin-film.

40. The structure of claim 33 wherein said second ferromagnetic thin-film has a magnetic moment greater than that of said first ferromagnetic thin-film.

41. The structure of claim 34 wherein said intermediate layer has a thickness of less than 30 Å.

42. The structure of claim 34 wherein said intermediate layer has substantially that same form in that same crystal lattice class and does said second ferromagnetic thin-film.

43. The structure of claim 34 wherein said intermediate layer is formed of a substantially non-magnetic, conductive alloy.

44. The structure of claim 34 wherein said second composite thin-film has a thickness of less than 100 Å.

45. The structure of claim 34 wherein said third ferromagnetic thin-film has a composition differing from that of said fourth ferromagnetic thin-film.

46. The structure of claim 44 wherein said third ferromagnetic thin-film has a thickness of less than 25 Å.

47. The structure of claim 45 wherein said third ferromagnetic thin-film has a thickness differing from that of said fourth ferromagnetic thin-film.

48. The structure of claim 45 wherein said third ferromagnetic thin-film has a magnetic moment greater than that of said fourth ferromagnetic thin-film.

49. A magnetoresistive thin-film layered structure, said structure comprising:

a substrate having a major surface portion;

a magnetoresistive, anisotropic first ferromagnetic thin-film provided on said substrate major surface portion;

an intermediate layer provided on said first ferromagnetic thin-film with a thickness of less than 30 Å, said intermediate layer being formed of an alloy comprising copper and gold; and a magnetoresistive, anisotropic second ferromagnetic thin-film provided on said intermediate layer, said gold being present in said copper in said alloy in said intermediate layer in an amount sufficient to permit antiferromagnetic coupling between said first and second ferromagnetic thin-films.

50. The structure of claim 1 wherein said alloy has one said component therein in greater proportion than that one remaining, and with that one component remaining being present in said alloy in an amount sufficient to permit antiferromagnetic coupling between said first and second ferromagnetic thin-films.

* * * * *

UNITED STATES PATENT AND TRADEMARK OFFICE
CERTIFICATE OF CORRECTION

PATENT NO. : 5,595,830

DATED : JANUARY 21, 1997

INVENTOR(S) : JAMES M. DAUGHTON

It is certified that error appears in the above-indentified patent and that said Letters Patent is hereby corrected as shown below:

Col. 6, line 4, before "Hence", delete "10"

Col. 7, line 60, delete "provide", insert --provided--

Col. 7, line 65, after "11", insert --,--

Col. 9, line 47, delete "thinfilms", insert --thin-films--

Signed and Sealed this

Twenty-seventh Day of May, 1997

Attest:

BRUCE LEHMAN

Attesting Officer

Commissioner of Patents and Trademarks